United States Patent [19]

Tanaka

[11] Patent Number: 4,967,246
[45] Date of Patent: Oct. 30, 1990

[54] STRUCTURE OF INSULATED GATE BIPOLAR TRANSISTORS

[75] Inventor: Akio Tanaka, Tokyo, Japan

[73] Assignee: NEC Corporation, Japan

[21] Appl. No.: 261,708

[22] Filed: Oct. 24, 1988

[30] Foreign Application Priority Data

Oct. 27, 1987 [JP] Japan ................................ 62-272216

[51] Int. Cl.⁵ ........................................... H01L 29/78
[52] U.S. Cl. ................................ 357/23.4; 357/23.14; 357/38; 357/39; 357/42; 357/43; 357/86; 357/89
[58] Field of Search ...................... 357/23.4, 43, 23.14, 357/38, 39, 42, 86, 89

[56] References Cited

U.S. PATENT DOCUMENTS 4,712,124 12/1987 Stupp ...................................... 357/43

Primary Examiner—Edward J. Wojciechowicz
Attorney, Agent, or Firm—Laff, Whitesel, Conte & Saret

[57] ABSTRACT

There is disclosed the structure of an insulated gate bipolar transistor which is formed in an n-type island formed in a p-type substrate and comprises an n-type well and a p-type base in the island in a spacing relationship, n-type and p-type source regions in the n-type well, an n-type drain in the base and an extension projecting from the base, and an integrated circuit is fabricated on the single substrate by virtue of the junction isolations.

5 Claims, 3 Drawing Sheets

PRIOR-ART

STRUCTURE OF INSULATED GATE BIPOLAR TRANSISTORS

FIELD OF THE INVENTION

This invention relates to the structure of semiconductor device and, more particularly, to an insulated gate bipolar transistor (which is sometimes abbreviated as "IGBT") incorporated in the semiconductor device.

BACKGROUND OF THE INVENTION

A typical example of the insulated gate bipolar transistor is illustrated in FIG. 1 of the drawings. The prior-art insulated gate bipolar transistor is of the lateral type and fabricated on an n-type semiconductor substrate 1. The insulated gate bipolar transistor comprises a heavily doped p-type drain region 2 and a p-type base region 3 both formed in the semiconductor substrate 1 in spacing relationship, a heavily doped n-type source region 4 and a heavily doped p-type source region 5 contiguous to each other and formed in the base region 3, and an insulating film 7 covering the surface of the semiconductor substrate 1. The insulated gate bipolar transistor further comprises a gate electrode 8 partially embedded into the insulating film 7 over those regions serving as the heavily doped n-type source region 4, the p-type base region 3 and the surface portion of the semiconductor substrate 1, so that the part of the insulating film 7 beneath the gate electrode 8 serves as a gate insulating film 9. In the insulating film 7 are formed contact windows one of which is filled with drain electrode 10 contacting the drain region 2 and the other of which allows a source electrode 11 to be in contact with the source regions 5 and 6.

In operation, an appropriate positive biasing voltage is applied to the gate electrode 8, an n-type channel takes place in the surface portion of the p-type base region 3 underneath the gate insulating film 7. Then, the n-type source region 4 and the surface portion of the n-type semiconductor substrate 1 are bridged by the n-type channel, and, for this reason, electrons flow from the n-type source region 4 into the semiconductor substrate 1. When the electrons are supplied to the semiconductor substrate 1, the semiconductor substrate 1 is decreased in potential level, so that the p-n junction between the p-type drain region 2 and the semiconductor substrate 1 is forwardly biased to inject holes into the semiconductor substrate 1. This hole injection results in reduction in resistance of the semiconductor substrate, and, accordingly, the insulated gate bipolar transistor is improved in on-resistance. Generally, an usual DMOS ( Double-diffused Metal Oxide Semiconductor ) device has a drawback in high resistivity of the semiconductor substrate, but the insulated gate bipolar transistor is free from the drawback inherent in the DMOS device.

However, a difficulty is encountered in the prior-art insulated gate bipolar transistor in implementation of an integrated complementary inverter circuit. Namely, the n-type semiconductor substrate is used for fabrication of the n-channel type insulated gate bipolar transistor illustrated in FIG. 1, and, on the other hand, a p-channel type insulated gate bipolar transistor is fabricated on a p-type semiconductor substrate. Then, the semiconductor substrates different in conductivity type should be provided for fabrication of the n-channel type and p-channel type insulated gate bipolar transistors, respectively. However, the complementary inverter circuit is implemented by using both the n-channel type insulated bipolar transistor and the p-channel type bipolar transistor but is allowed to use only one kind of semiconductor substrate. This difficulty is serious in high-speed push-pull circuits used in a pulse-width modulation for controlling an electric motor unit, because each of the transistors incorporated in the push-pull circuits be small in resistance on both of the source and sink sides such as the insulated gate bipolar transistor. However, each of the push-pull circuits is hardly fabricated on a single semiconductor chip, so that the circuits are implemented as discrete circuits. This results in increasing in production cost and in large amount of occupation space. The problem is also serious in an open-drain configuration incorporated in a solenoid-driver circuit and a display driver circuit. This is because of the fact that the drain region is liable to be equal in voltage level to the semiconductor substrate, then a self-isolation technique usually applied to a MOS ( Metal Oxide Semiconductor ) device is hardly employed to the integrated circuit formed by the insulated gate bipolar transistors of the lateral type.

SUMMARY OF THE INVENTION

It is therefore an important object of the present invention to provide an insulated gate bipolar transistor which has a structure appropriate for fabrication of an integrated circuit.

It is also an important object of the present invention to provide the structure of semiconductor device formed by insulated gate bipolar transistors different in channel conductivity type.

In accordance with one aspect of the present invention, there is provided an insulated gate bipolar transistor comprising: (a) a semiconductor region of a first conductivity type having a surface portion; (b) a first impurity region of a second conductivity type formed in the surface portion, the second conductivity type being opposite to the first conductivity type; (c) a source electrode contacting the first impurity region; (d) a second impurity region of the second conductivity type formed in the surface portion and spaced apart from the first impurity region by a channel forming portion of the surface portion; (e) a third impurity region of the first conductivity type formed in the second impurity region; (f) a drain electrode contacting the third impurity region; (g) a gate insulating film formed on the channel forming portion; and (h) a gate electrode formed on the gate insulating film.

In accordance with another aspect of the present invention, there is provided an insulated gate bipolar transistor comprising: (a) a semiconductor layer of a first conductivity type having a surface portion; (b) a well of the first conductivity type formed in the surface portion of the semiconductor layer and having an impurity atom concentration higher than that of the semiconductor layer; (c) a base region of a second conductivity type formed in the surface portion of the semiconductor layer and spaced apart from the well, the second conductivity type being opposite to the first conductivity type; (d) a heavily doped first source region of the first conductivity type formed in the well; (e) a heavily doped second source region of the second conductivity type formed in the well and located in adjacent to the heavily doped first source region; (f) a source electrode contacting the heavily doped first and second source regions; (g) a heavily doped drain region of the first conductivity type formed in the base region; (h) a drain electrode contacting the heavily doped drain region; (i) an extension of the second conductivity type projecting from an upper portion of the base region and having an impurity atom concentration lower than that of the base region; (j) a gate insulating film formed over the surface portion between the extension and the well and over a portion of the well between the heavily doped second source region and the surface portion; and (k) a gate electrode formed on the gate insulating film.

In accordance with still another aspect of the present invention, there is provided a semiconductor device fabricated on a semiconductor substrate of one conductivity type, comprising: (a) first and second semiconductor layers of the opposite conductivity type formed in the semiconductor substrate and spaced apart from each other; (b) a first insulated gate bipolar transistor comprising (b-1) a base region of the one conductivity type formed in the first semiconductor layer, (b-2) a heavily doped first source region of the one conductivity type formed in the base region, (b-3) a heavily doped second source region of the opposite conductivity type formed in the base region and located in adjacent to the heavily doped first source region, (b-4) a heavily doped drain region of the one conductivity type formed in the first semiconductor layer and spaced apart from the base region by a surface portion of the first semiconductor layer, (b-5) a gate insulating film formed over the base region between the heavily doped second source region and the surface portion of the first semiconductor layer, (b-6) a gate electrode formed on the gate insulating film and coupled to an input node, (b-7) a source electrode contacting the heavily doped first and second source region and coupled to a first source of voltage, and (b-8) a drain electrode contacting the heavily doped drain region and coupled to an output node; and (c) a second insulated gate bipolar transistor comprising (c-1) a well of the opposite conductivity type formed in the second semiconductor layer and having an impurity atom concentration higher than that of the second semiconductor layer, (c-2) a base region of the one conductivity type formed in the second semiconductor layer and spaced apart from the well, (c-4) a heavily doped third source region of the opposite conductivity type formed in the well, (c-5) a heavily doped fourth source region of the one conductivity type formed in the well and located in adjacent to the heavily doped third source region, (c-6) a source electrode contacting the heavily doped third and fourth source regions and coupled to a second source of voltage, (c-7) a heavily doped drain region of the opposite conductivity type formed in the base region, (c-8) a drain electrode contacting the heavily doped drain region and coupled to the output node, (c-9) an extension of the one conductivity type projecting from an upper portion of the base region and having an impurity atom concentration lower than that of the base region, (c-10) a gate insulating film formed over a surface portion of the second semiconductor layer between the extension and the well and over a portion of the well between the heavily doped fourth source region and the surface portion, and (c-11) a gate electrode formed on the gate insulating film and coupled to the input node.

BRIEF DESCRIPTION OF THE DRAWINGS

The features and advantages of a semiconductor device according to the present invention will be more clearly understood from the following description taken in conjunction with the accompanying drawings in which.

DESCRIPTION OF THE PREFERRED EMBODIMENTS

First embodiment

Figure 1:
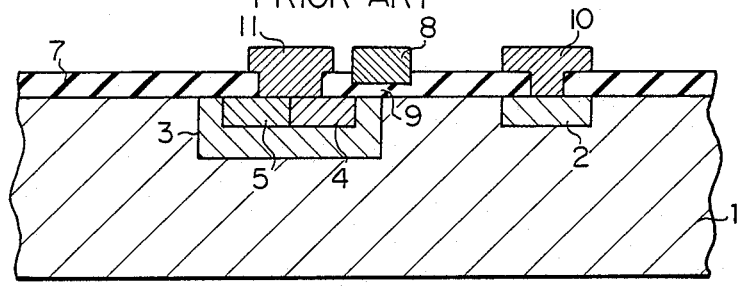
FIG. 1 is a cross sectional view showing the structure of a prior-art insulated gate bipolar transistor.
Figure 2:
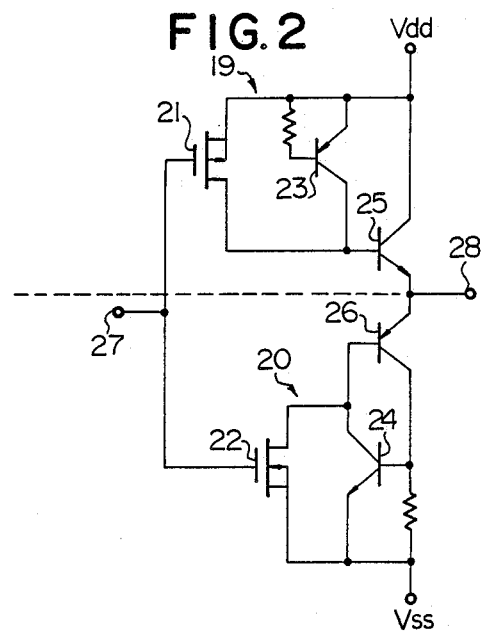
FIG. 2 is a circuit diagram showing a circuit arrangement of the semiconductor device to which the present invention appertains.

Referring first to FIG. 2 of the drawings, there is shown the circuit arrangement of a push-pull circuit to which the present invention appertains. The push-pull circuit is coupled between two sources of voltage Vdd and Vss and comprises two insulated gate bipolar transistors 19 and 20 which are provided with field effect transistor sections 21 and 22 and bipolar transistor sections 23, 24, 25 and 26, respectively. An input node 27 is shared by the field effect transistor sections 21 and 22, and an output node 28 is provided between the two bipolar transistor sections 25 and 26. The push-pull circuit thus arranged is responsive to an input signal swinging its voltage level between high and low voltage levels, and the field effect transistor sections 21 and 22 alternatively turn on to drive the bipolar transistor sections 25 and 26, respectively.

Figure 3:
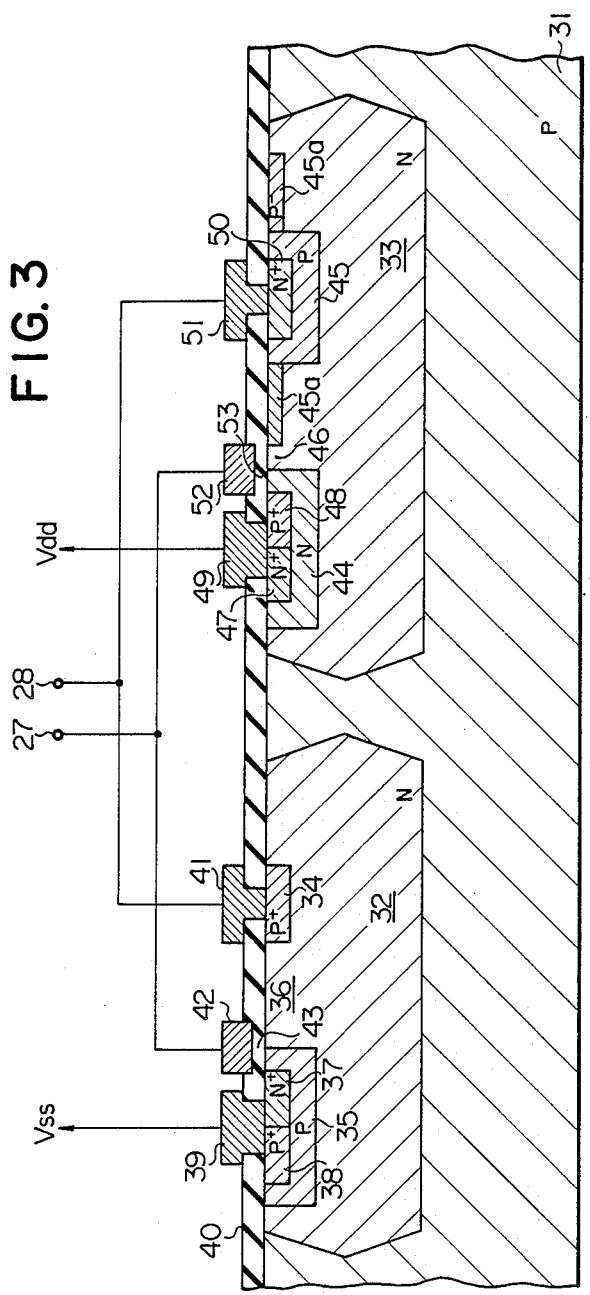
FIG. 3 is a cross sectional view showing the structure of a semiconductor device embodying the present invention.

Turning to FIG. 3, there is shown the structure of a semiconductor device implementing the push-pull circuit on a p-type semiconductor substrate 31 of, for example, single crystal silicon. In the p-type semiconductor substrate 31 are formed islands 32 and 33 which are formed of an n-type epitaxial silicon. Then, the islands 32 and 33 are isolated from the semiconductor substrate 31 under an appropriate reverse biasing conditions by virtue of the p-n junction formed therebetween. The insulated gate bipolar transistors 21 and 22 are formed in the islands 33 and 32, respectively. Namely, in the n-type island 32 are formed a heavily doped p-type drain region 34 and a p-type base region 35 which are spaced apart from each other by a surface portion 36 of the n-type island 32. In the p-type base region 35 are provided a heavily doped n-type source region 37 and a heavily doped p-type source region 38 contiguous to each other, and a source electrode 39 is in contact with the source regions 37 and 38 through a contact window formed in an insulating film 40 of, for example, silicon oxide covering the semiconductor substrate 31. Similarly, a drain electrode 41 is in contact with the drain region 34 through a contact window formed in the insulating film 40, and the source and drain electrodes are coupled to the source of voltage Vss and and the output node 28, respectively. A gate electrode 42 is partially embedded into the insulating film 40, so that a gate insulating film 43 is provided beneath the gate electrode 42 and located over a surface portion of the p-type base region 35 and the surface portion 36 of the island 32. The input signal swinging its voltage between the high and low levels is supplied from the input node 27 to the gate electrode 42.

On the other hand, an n-type well 44 and a p-type base region 45 are formed in the n-type island 33 in spacing relationship, and a lightly doped extension 45a projects from the upper portion of the p-type base region 45, but a surface portion 46 intervenes between the n-type well 44 and the extension 45a. In the n-type well 44 are formed a heavily doped n-type source region 47 and a heavily doped p-type source region 48 which are contiguous to each other. The n-type and p-type source regions 47 and 48 are in contact with a source electrode 49 passing through a contact window formed in the insulating film 40. In the p-type base region 45 is formed a heavily doped n-type drain region 50 which is in contact with a drain electrode 51 through a contact window formed in the insulating film 40. The source and drain electrodes 49 and 51 are also coupled to the source of voltage Vdd and the output node 28, respectively. A gate electrode 52 is partially embedded into the insulating film 40, and a gate insulating film 53 is formed over a surface portion of the base region 43 and the surface portion 46 of the island 33.

The gate electrode 52 is also coupled to the input node 27 as well as the gate electrode 42, so that the input signal supplied to the input node 27 causes an n-type channel and a p-type channel to alternatively take place in the respective surface portions of the p-type and n-type regions 35 and 43, respectively. When the n-type channel takes place in the p-type region 35, electrons flow into the n-type island 32 to cause the island 32 to be decreased in potential level. Then, the p-n junction between the island 32 and the drain region 34 is forwardly biased to allow holes to be injected from the p-type drain region, and, for this reason, the island 32 is decreased in resistance, thereby improving the on-conductance. Similarly, if the gate electrode 52 is negatively biased with respect to the source regions 47 and 48, a p-type channel is produced in the surface portion 46 for providing a bridge between the p-type source region 48 and the extension 45a. Then, holes are supplied to the p-type base region 45 through the channel and the extension 45a. This results in that the p-type base region 45 is increased in potential level, which in turn results in forwardly biasing a p-n junction between the heavily doped n-type drain 50 and the p-type base region 45. When the p-n junction is forwardly biased, electrons are injected from the heavily doped n-type drain region 50 to the p-type base region 45, thereby causing the n-p-n type bipolar transistor 23, which is formed by the n-type island 33, the p-type base region 45 and heavily doped n-type drain region 50, to turn on to further drive the bipolar transistor 25. The insulated gate bipolar transistor 19 is decreased in on-resistance, because a conductivity modulation takes place in the substrate under operation in the saturation region, thereby reducing in on-resistance thereof.

The breakdown voltage of the insulated gate bipolar transistor 19 is dominated by the resistivity of the n-type epitaxial material used for the island 33, the resistance and the projection length of the p-type extension and the thickness of the gate insulating film 53 which are easily modified in the design stage, so that the insulated gate bipolar transistor 19 is improved in breakdown voltage by selection of above parameters.

In order to increase the threshold voltage of the field effect transistor section 21, the surface portion 46 of the n-type island 33 should be increased in impurity atom concentration, but a break down is liable to take place the p-n junction therebetween due to the high impurity atom concentration. This means that there is a trade-off between the breakdown voltage and the threshold voltage. In this instance, the n-type well 44 is provided in the neighborhood of the heavily dope p-type source region 48, so that the epitaxial material is decreased in impurity atom concentration to about a tenth. The threshold voltage of the field effect transistor section 21 is dominated by the impurity atom concentration of the n-type well 44. Then, a high breakdown voltage and a high threshold voltage are simultaneously achieved in the insulated gate bipolar transistor 19 according to the present invention. Moreover, the n-type well is conducive to improvement in transconductance of the field effect transistor section 21. This is because of the fact that the effective channel length is dominated by the n-type well 44 and, for this reason, shortened. In detail, the channel takes place in the surface portion 46 of the n-type island 33 in the initial stage of turning on behavior due to the low threshold voltage, and the channel extends in the heavily doped n-type well 44 by decreasing the voltage level applied to the gate electrode 52. In this situation, the channel in the surface portion 46 is in the state just like the pinch-off state, so that the carriers are drifted in the channel produced in the n-type well 44 and, thereafter, travel the surface portion 46 at extremely high speed by the agency of an strong electric field, thereby reaching the p-type extension 45a in a short time period. In this instance, the n-type well 44 has an impurity atom concentration of about $1.0 \times 10^{16}$ atoms/cm$^3$, and the epitaxial material used for the island 33 has an impurity atom concentration of about $6.5 \times 10^{14}$ atoms/cm$^3$.

Moreover, the insulated gate bipolar transistor 19 is improved in breakdown voltage between the gate and the p-type base region 45 by virtue of the lightly doped p-type extension 45a. The p-type extension 45a surrounding the p-type base region 45 causes the depletion layer between the n-type island 33 and the p-type base region 45 to be increased in radius of curvature, thereby improving the breakdown voltage therebetween. Moreover, the extension 45a is relatively small in depth, so that the extension 45a tends to be fully depleted under a biasing voltage applied to the gate electrode. This results in a considerable voltage drop of the drain voltage. This is coducive to improvement in breakdown voltage. In this instance, the p-type base region 45 has an impurity atom concentration of about $5.0 \times 10^{17}$ atoms/cm$^3$, and the lightly doped p-type extension 45a has an impurity atom concentration of about $1.0 \times 10^{17}$ atoms/cm$^3$.

Second embodiment

Figure 4:
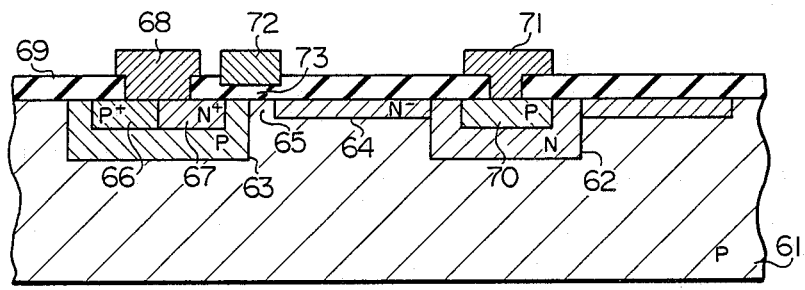
FIG. 4 is a cross sectional view showing the structure of another semiconductor device embodying the present invention.

Turning to FIG. 4 of the drawings, another integrated circuit is implemented by using a plurality of insulated gate bipolar transistors one of which is shown therein. In a p-type semiconductor substrate 61 are formed an n-type well 62 and a p-type well 63 in spacing relationship, and a lightly doped n-type extension 64 projects from the upper portion of the p-type well 63, but a surface portion 65 intervenes between the n-type well 62 and the extension 64. In the p-type well 63 are formed a heavily doped p-type source region 66 and a heavily doped n-type source region 67 which are contiguous to each other. The n-type and p-type source regions 67 and 66 are in contact with a source electrode 68 passing through a contact window formed in an insulating film 69. In the n-type well 62 is formed a heavily doped p-type drain region 70 which is in contact with a drain electrode 71 through a contact window formed in the insulating film 69. A gate electrode 72 is partially embedded into the insulating film 69, and a gate insulating film 73 is formed over a surface portion of the p-type well 63 and the surface portion 65.

A self-isolation is used for the insulated gate bipolar transistors thus arranged instead of the junction isolation, so that a plurality of insulated gate bipolar transistors are fabricated on the single substrate 61. The prior-art insulated gate bipolar transistor has the drain electrode equal in voltage level to the substrate, so that the self-isolation shown in FIG. 4 can not applied therein.

In general, the open-drain circuit is applicable to many applications, and a low on-resistance and a low production cost are desirable. In a fabrication process for a semiconductor device with component elements isolated by p-n junctions, about 20% of the production cost is consumed for forming the junction isolations, and insulated gate bipolar transistor without the junction isolation is conducive to reduction in production cost.

Although particular embodiments of the present invention have been shown and described, it will be obvious to those skilled in the art that various changes and modifications may be made without departing from the spirit and scope of the present invention.

What is claimed is:

1. A semiconductor device comprising:
   (a) a semiconductor layer of a first conductivity type having a surface portion;
   (b) a well of said first conductivity type formed in the surface portion of said semiconductor layer and having an impurity atom concentration higher than that of said semiconductor layer;
   (c) a base region of a second conductivity type formed in the surface portion of said semiconductor layer and spaced apart from said well, said second conductivity type being opposite to said first conductivity type;
   (d) a heavily doped first source region of said first conductivity type formed in said well;
   (e) a heavily doped second source region of said second conductivity type formed in said well and located adjacent to said heavily doped first source region;
   (f) a source electrode contacting said heavily doped first and second source regions;
   (g) a heavily doped drain region of said first conductivity type formed in said base region;
   (h) a drain electrode contacting said heavily doped drain region;
   (i) an extension of said second conductivity type projecting from an upper portion of said base region and having an impurity atom concentration lower than that of said base region;
   (j) a gate insulating film formed over said surface portion between said extension and said well and over a portion of the well between said heavily doped second source region and the surface portion; and
   (k) a gate electrode formed on said gate insulating film, in which said base region is surrounded by said extension.

2. A semiconductor device as set forth in claim 1, in which said well is about ten times larger in impurity concentration than said semiconductor layer.

3. A semiconductor device fabricated on a semiconductor substrate of one conductivity type, comprising:
   (a) first and second semiconductor layers of the opposite conductivity type formed in said semiconductor substrate and spaced apart from each other;
   (b) a first insulated gate bipolar transistor comprising:
      (b-1) a base region of said one conductivity type formed in said first semiconductor layer,
      (b-2) a heavily doped first source region of said one conductivity type formed in said base region,
      (b-3) a heavily doped second source region of said opposite conductivity type formed in said base region and located adjacent to said heavily doped first source region,
      (b-4) a heavily doped drain region of said one conductivity type formed in said first semiconductor layer and spaced apart from said base region by a surface portion of said first semiconductor layer,
      (b-5) a gate insulating film formed over said base region between said heavily doped second source region and the surface portion of said first semiconductor layer,
      (b-6) a gate electrode formed on said gate insulating film and coupled to an input node,
      (b-7) a source electrode contacting said heavily doped first and second source region and coupled to a first source voltage, and
      (b-8) a drain electrode contacting said heavily doped drain region and coupled to an output node; and
   (c) a second insulated gate bipolar transistor comprising:
      (c-1) a well of said opposite conductivity type formed in said second semiconductor layer and having an impurity atom concentration higher than that of said second semiconductor layer,
      (c-2) a base region of said one conductivity type formed in said second semiconductor layer and spaced apart from said well,
      (c-3) a heavily doped third source region of said opposite conductivity type formed in said well,
      (c-4) a heavily doped fourth source region of said one conductivity type formed in said well and located adjacent to said heavily doped third source region,
      (c-5) a source electrode contacting said heavily doped third and fourth source regions and coupled to a second source of voltage;
      (c-6) a heavily doped drain region of said opposite conductivity type formed in said base region,
      (c-7) a drain electrode contacting said heavily doped drain region and coupled to said output node,
      (c-8) an extension of said one conductivity type projecting from an upper portion of said base region and having an impurity atom concentration lower than that of said base region formed in said second semiconductor layer,
      (c9) a gate insulating film formed over a surface portion of said second semiconductor layer between said extension and said well and over a portion of the well between said heavily doped fourth source region and the surface portion, and
      (c10) a gate electrode formed on said gate insulating film and coupled to said input node, in which said base region formed in said second semiconductor layer is surrounded by said extension.

4. A semiconductor device as set forth in claim 3, in which said well is about ten times larger in impurity concentration than one of said first and second semiconductor layers.

5. A semiconductor device comprising:
(a) a semiconductor region of a first conductivity type having a surface portion;
(b) a first impurity region of a second conductivity type formed in one part of said surface portion, said second conductivity type being opposite to said first conductivity type;
(c) a source electrode contacting said first impurity region;
(d) a second source impurity region of said second conductivity type formed in another part of said surface portion and spaced apart from said first impurity region by a channel forming portion formed in still another part of said surface portion;
(e) a third impurity region of said first conductivity type formed in said second impurity region;
(f) a drain electrode contacting said third impurity region;
(g) a gate insulating film formed on said channel forming portion; and
(h) a gate electrode formed on said gate insulating film, in which said second impurity region has a central portion and a lightly doped peripheral position smaller in depth than the central portion, said third impurity region being formed in said central portion, and in which said first impurity region is formed in a fourth impurity region of said first conductivity type, wherein said fourth impurity region has a surface portion forming a part of said channel forming portion so that said gate electrode is located on both the surface portion of said fourth impurity region and the other part of said channel forming portion between said fourth impurity region and said peripheral portion.

* * * * *